United States Patent
Henry et al.

(10) Patent No.: US 7,362,118 B2
(45) Date of Patent: Apr. 22, 2008

(54) PROBE WITH CONTACT RING

(75) Inventors: David W. Henry, Platte City, MO (US); William E. Thurston, Kansas City, MO (US)

(73) Assignee: Interconnect Devices, Inc., St. Davids, PA (US)

( * ) Notice: Subject to any disclaimer, the term of this patent is extended or adjusted under 35 U.S.C. 154(b) by 118 days.

(21) Appl. No.: 11/510,313

(22) Filed: Aug. 25, 2006

(65) Prior Publication Data

US 2008/0048701 A1  Feb. 28, 2008

(51) Int. Cl.
G01R 31/02 (2006.01)
(52) U.S. Cl. ...................... 324/761; 324/754
(58) Field of Classification Search ............. None
See application file for complete search history.

(56) References Cited

U.S. PATENT DOCUMENTS

| 4,245,645 | A |   | 1/1981  | Arseneault et al. |
|-----------|---|---|---------|-------------------|
| 4,597,622 | A | * | 7/1986  | Coe ............. 439/421 |
| 5,634,280 | A |   | 6/1997  | Hellier et al. |
| 5,718,040 | A |   | 2/1998  | Faure et al. |
| 5,801,544 | A |   | 9/1998  | Swart et al. |
| 6,039,695 | A |   | 3/2000  | Sakamoto et al. |
| 6,844,748 | B2 | * | 1/2005 | Sato et al. .......... 324/754 |
| 7,126,362 | B2 | * | 10/2006 | Yoshida et al. ...... 324/754 |
| 2004/0095157 | A1 |   | 5/2004 | Sato et al. |

\* cited by examiner

Primary Examiner—Vinh P Nguyen
(74) Attorney, Agent, or Firm—Pepper Hamilton LLP

(57) ABSTRACT

A spring probe having a barrel, plunger, spring and contact ring is provided in which the contact ring provides electrical contact between the plunger and the barrel. Two or more contact rings may be provided to improve the pointing accuracy of the probe.

12 Claims, 2 Drawing Sheets

PROBE WITH CONTACT RING

FIELD OF THE INVENTION

The present invention relates to spring probes and, more particularly, to spring probes with improved electrical performance and pointing accuracy.

BACKGROUND OF THE INVENTION

Conventional spring-loaded electrical contact probes generally include an outer receptacle, a barrel containing a movable plunger and a spring, which exerts a force against the tail of the plunger to bias the plunger outwardly from the barrel. The plunger may be depressed inwardly into the barrel a predetermined distance, under force directed against the spring.

Battery-type contacts and interconnect probes generally require compact, durable, highly reliable designs with circuit paths optimized for the best performance. These contacts and probes are typically employed in battery charging applications, mobile telecommunication applications, docking applications, and other portable electronic devices in addition to applications for testing electronics, printed circuit boards and computer chips, for example. They may be used as either power conductors or as signal carriers and are subject to a wide range of environmental conditions.

As products continue to shrink in size or increase in performance while maintaining current size, the need for smaller contacts continues to grow. The resultant probe often performs well mechanically but the electrical performance in certain instances is compromised by the action of the spring and device under test. Specifically, if the device under test pushes directly down on top of the plunger and the spring generates a force pushing directly up the desired contact between plunger and barrel, which is required for optimal electrical performance, can be very light or nonexistent. The result is a poor, unreliable electrical performance for the probe.

As is known in the art, current travels in parallel down all available paths in a quantity dependent upon the path's resistance. A common spring, by nature of its design and composition, has a very large resistance and causes poor-electrical performance of the probe if it is the main circuit path. Likewise, large resistances between the barrel inner diameter ("ID") and plunger, referred to as the internal contact resistance, may also lead to poor electrical performance or failure of the probe. Large internal contact resistances are generally due to low contact force between barrel ID and plunger, poor conductive material of barrel and plunger including plating material and contaminates such as dirt, lint, or lubricants. To improve electrical performance of the probe, designs minimize the internal contact resistance by proper material selection, plating selection, attention to cleanliness/handling, and increasing the contact force between the barrel ID and plunger through efforts called biasing. Biasing is the action of forcing the plunger's bearing surface against the barrel ID.

In an effort to improve biasing in probes many designs have been generated. One design utilizes a bias cut on the tail of the plunger where the tail of the plunger is cut at an angle. A large side force is created from the spring pushing against the bias cut creating firm, constant contact force between barrel and plunger. This contact force ensures that the current will flow from the plunger to the barrel and not through the spring and also provides the lowest contact resistance between barrel and plunger. The disadvantage to this type of design is the higher friction that is created between plunger and barrel resulting in failure of the probe due to mechanical wear. Another problem is often the pointing accuracy of the probe suffers with a bias cut design. The pointing accuracy of a probe is the maximum radial departure of a probe tip from the center line of the probe barrel. With a bias cut, the plunger tail is forced to one side of the barrel which results in the tip being forced away from the center line of the probe. Additionally, as the probe wears, the pointing accuracy may degrade.

SUMMARY

The present invention provides a probe with a barrel, spring and plunger biased outwardly from the barrel by the spring. The probe includes one or more contact rings in electrical contact with the tail of the plunger to ensure electrical contact between the plunger and the barrel. The contact ring provides a consistent electrical contact throughout the travel of the plunger within the barrel and improves the pointing accuracy of the probe.

DETAILED DESCRIPTION

Figures 1, 2, 3, 4:
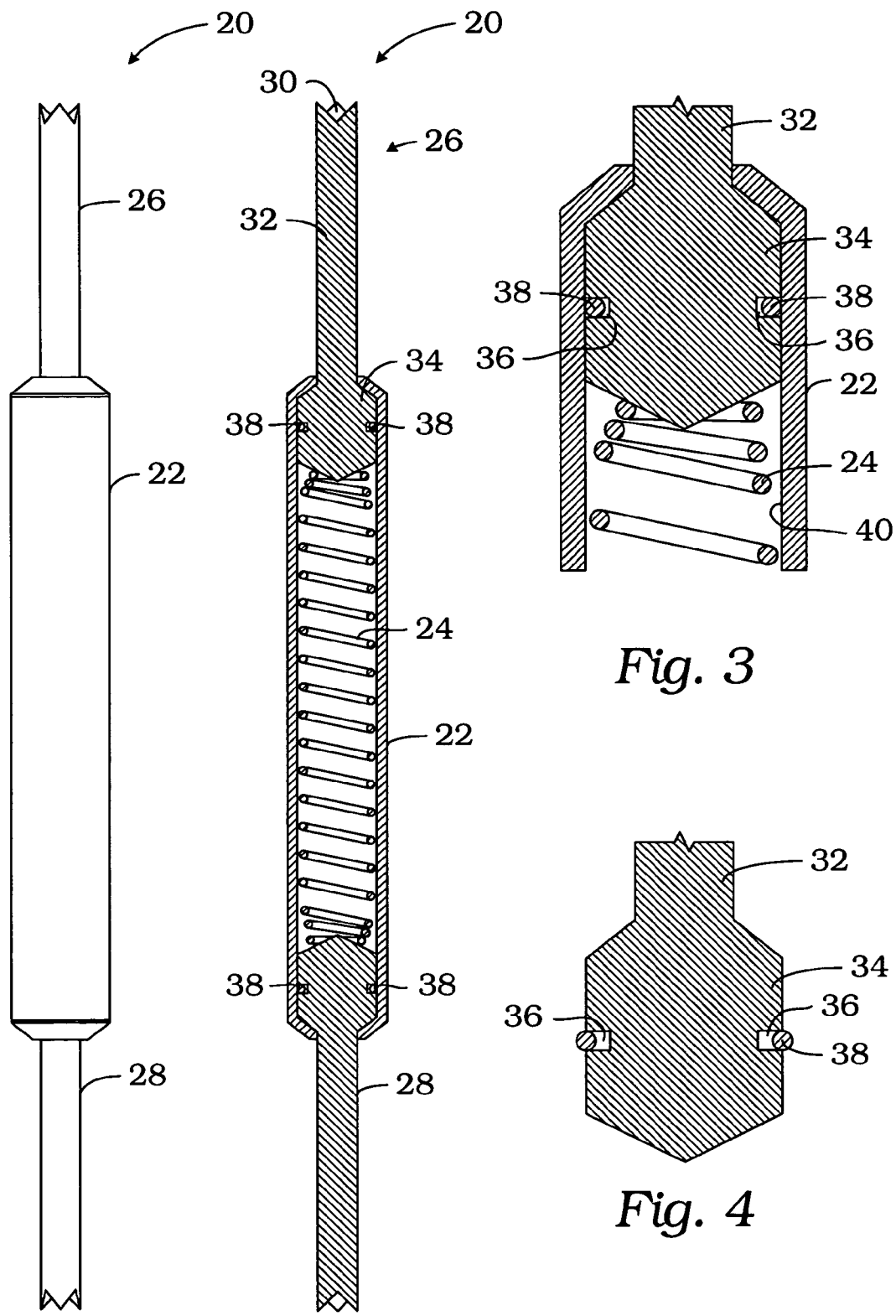
FIG. 1 is a side elevational view of a double-ended probe according to the present invention.
FIG. 2 is a cross-sectional side elevational view of the probe of FIG. 1.
FIG. 3 is an enlarged fragmentary cross-sectional side elevational view of the probe of FIG. 2 illustrating details of the contact ring and probe interface.
FIG. 4 is an enlarged fragmentary cross-sectional side elevational view of the plunger tail and contact ring removed from the barrel.

Detailed embodiments of the invention are disclosed herein, however, it is to be understood that the disclosed embodiments are merely exemplary of the invention which may be embodied in various forms. Therefore, specific structural and functional details disclosed herein are not to be interpreted as limiting, but rather merely as a basis for teaching one skilled in the art to variously employ the present invention in any appropriately detailed form, and as a basis for the claims.

Referring to FIGS. 1-4, a test probe of the present invention is generally indicated by reference numeral 20. Probe 20 includes an elongated tubular barrel 22, a spring 24 seated within the barrel 22, and a pair of plungers 26 and 28 slideably mounted within the barrel and extending outwardly therefrom for contacting a test point of a device under test. It should be understood that the drawings of a double-ended probe is for illustrative purposes only. The teachings herein may be applied to other probes such as single-ended probes, for example.

The plunger 26 includes a tip 30, a shaft 32 and a tail 34. The tail 34 of plunger 26 has a larger cross-section than the shaft 32. The barrel 22 is crimped at each end to capture the tail of each plunger 26 and 28. The spring 24 biases the plungers 26 and 28 outwardly from the barrel 22.

The plunger tail 34 includes an annular slot 36 into which a contact ring 38 is inserted. Contact ring 38 is biased outwardly from the slot 36 in order to make electrical contact with the inner surface 40 of barrel 22. When the contact ring 38 is in a relaxed or uncompressed state, it has an outside diameter larger than the diameter of plunger tail 34 and inside diameter of the barrel. Accordingly, in the relaxed state, contact ring 38 extends beyond slot 36 (see FIG. 4) to ensure that the contact ring 38 makes good electrical contact with the inner surface 40 of barrel 22 when the plunger tail 34 is inserted and during use.

Figure 5:
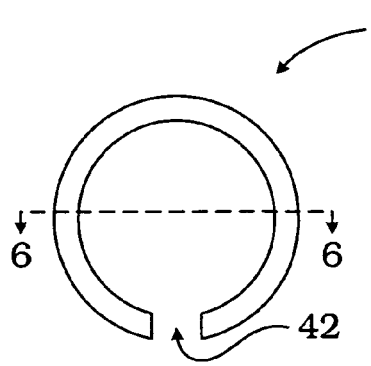
FIG. 5 is an enlarged plan view of a contact ring.
Figure 6A:
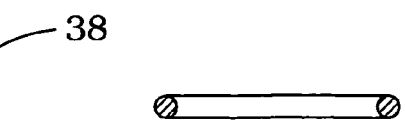
FIG. 6A is an enlarged cross-sectional view of the contact ring of FIG. 5 taken along line 6-6.
Figure 6B:
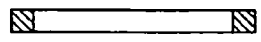
FIG. 6B is an enlarged cross-sectional view of an alternate embodiment of the contact ring of FIG. 5 taken along line 6-6.

Referring to FIGS. 5 and 6A, contact ring 38 is generally circular with a compression gap 42 to allow the ring to be compressed when inserted into the probe barrel 22 (see FIGS. 2 and 3) and to permit air to pass by the tail 34 and ring 38. Contact ring 38 may have a circular cross-section as shown in FIG. 6A or may have a square or rectangular cross-section, for example, as shown in FIG. 6B. Other cross-sectional configuration may be used to ensure good electrical contact between the plunger 26 and barrel 22 (see FIGS. 2 and 3). Contact ring 38 may be made of a highly conductive material or a spring material with a conductive plating, for example.

Figure 7:
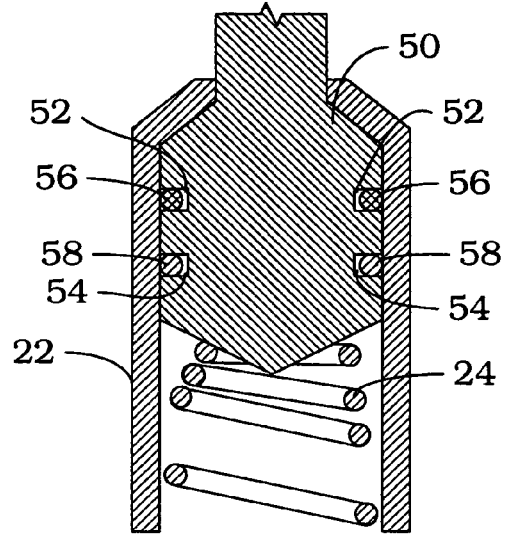
FIG. 7 is an enlarged fragmentary cross-sectional side elevational view of a plunger tail configured for two contact rings.

Referring to FIG. 7, a plunger tail 50 may include two annular slots 52 and 54 containing rings 56 and 58 respectively. Configuring the plunger tail 50 with two rings 56 and 58 improves the pointing accuracy of the probe. The probe pointing accuracy is the maximum radial departure of the probe tip from the centerline of the probe barrel. Use of two rings 56 and 58 helps keep the plunger tail 50 centered within the barrel 22 throughout the travel of the plunger as the spring 24 is compressed.

Contact rings 56 and 58 may be made of the same or different material, depending on the application. For example, both contact rings 56 and 58 maybe made of a highly conductive material or have a conductive plating or coating to ensure good electrical contact between the plunger and barrel 22. If the probe is to be used in a dirty environment, for example, ring 56 may be made of a Teflon, plastic, or composite material to keep the inside surface 40 of barrel 22 clean for ring 58 which may be made of a highly conductive material. In this example, the ring 56 acts as a squeegee to sweep dirt particles off of the inside surface 40 of barrel 22 and ensure that ring 58 has a clean contact with the barrel. By providing a clear contact surface the electrical performance of the probe is improved and the life expectancy of the probe may be extended.

Figure 8:
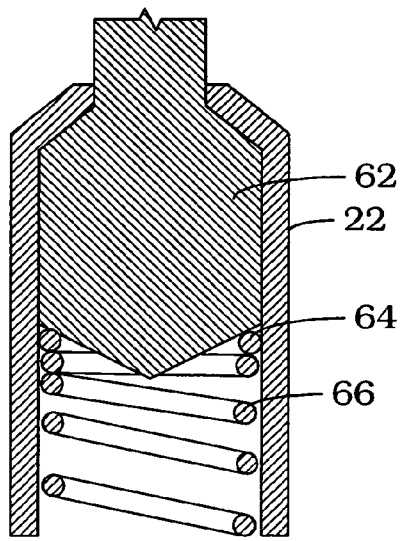
FIG. 8 is an enlarged fragmentary cross-sectional side view of a plunger tail and a contact ring below the plunger tail.

Referring to FIG. 8, a plunger 60 and tail 62 seated in barrel 22 may include a contact ring 64 located between the plunger tail 62 and the spring 66. The spring 66 holds the contact ring 64 in electrical contact with the tail 62 as the plunger moves into and out of the barrel 20.

Figure 9:
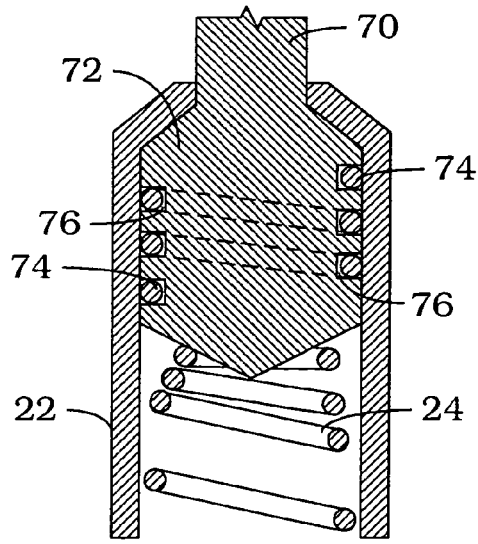
FIG. 9 is an enlarged fragmentary cross-sectional side view of a plunger tail and a helical contact ring.
Figure 10:
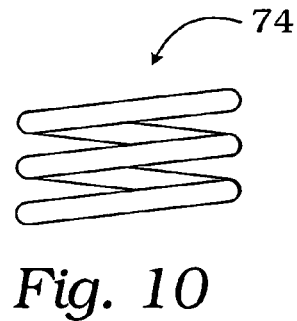
FIG. 10 is a side elevational view of the helical contact ring of FIG. 9.

Referring to FIGS. 9 and 10, another embodiment of a plunger 70, tail 72 and contact ring 74 is illustrated. Tail 72 includes a spiral slot 76 which is cut around the periphery of the tail 72 and into which the helical contact ring 74 is seated. Helical contact ring 74 includes two and one-half turns as illustrated but may include only one turn or additional turns. The helical contact ring 74 also helps improve the pointing accuracy of the probe as discussed herein above.

It is to be understood that while certain forms of this invention have been illustrated and described, is it not limited thereto except insofar as such limitations are included in the following claims.

Having thus described the invention, what is claimed as new and desired to be secured by Letters Patent is as follows:

1. A spring probe comprising:
   a barrel having an interior surface,
   a plunger slidably mounted within said barrel, said plunger having a contact tip extending from said barrel and a tail portion captured by said barrel,
   a spring seated within said barrel for biasing said plunger axially and outwardly of said barrel, and
   a contact ring in electrical communication with said tail portion of said plunger and said barrel.

2. The spring probe as set forth in claim 1 wherein said ring is biased outwardly against said interior surface of said barrel.

3. The spring probe as set forth in claim 1 wherein said tail portion of said plunger includes an annular groove adapted to receive said contact ring.

4. The spring probe as set forth in claim 1 wherein said tail portion of said plunger includes a helical groove adapted to receive said contact ring.

5. The spring probe as set forth in claim 1 wherein said tail portion of said plunger includes a first annular groove adapted to receive said contact ring, and a second annular groove adapted to receive a second contact ring.

6. The spring probe as set forth in claim 5 wherein said second contact ring is made of a conductive material.

7. The spring probe as set forth in claim 5 wherein said second contact ring is made of a nonconductive material.

8. A spring probe comprising:
   a barrel having an interior surface,
   a plunger slidably mounted within said barrel, said plunger having a contact tip extending from said barrel and a tail portion captured by said barrel, said tail portion having an annular groove,
   a spring seated within said barrel for biasing said plunger axially and outwardly of said barrel, and
   a generally C-shaped contact ring seated in said annular groove of said tail portion of said plunger in electrical communication with said tail portion of said plunger and said interior surface of said barrel.

9. The spring probe as set forth in claim 8 wherein said ring is biased outwardly against said interior surface of said barrel.

10. The spring probe as set forth in claim 8 wherein said tail portion of said plunger includes a second annular groove and further comprising a second contact ring seated in said second annular groove.

11. The spring probe as set forth in claim 10 wherein said second contact ring is made of a conductive material.

12. The spring probe as set forth in claim 10 wherein said second contact ring is made of a nonconductive material.

* * * * *